(12) United States Patent
Yamana et al.

(10) Patent No.: US 6,320,738 B1
(45) Date of Patent: Nov. 20, 2001

(54) MONOLITHIC CERAMIC ELECTRONIC COMPONENT AND METHOD FOR MAKING THE SAME

(75) Inventors: Tsuyoshi Yamana, Kyoto; Takaharu Miyazaki, Shiga-ken, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/699,550

(22) Filed: Oct. 30, 2000

(30) Foreign Application Priority Data

Oct. 28, 1999 (JP) .................................................. 11-306745

(51) Int. Cl.$^7$ ...................................................... H01G 4/06
(52) U.S. Cl. ..................... 361/321.2; 361/306.3; 29/25.41
(58) Field of Search ........................ 361/306.3, 311–313, 361/320, 321.2, 321.3, 321.4, 321.5; 29/25.41, 25.42

(56) References Cited

U.S. PATENT DOCUMENTS

| | | | |
|---|---|---|---|
| 5,117,326 | * | 5/1992 | Sano et al. ..................... 361/321.4 |
| 5,731,950 | * | 3/1998 | Sakamoto et al. .............. 361/321.4 |
| 5,822,176 | * | 10/1998 | Sano et al. ..................... 361/321.4 |

* cited by examiner

Primary Examiner—Anthony Dinkins
(74) Attorney, Agent, or Firm—Ostrolenk, Faber, Gerb & Soffen, LLP

(57) ABSTRACT

A monolithic ceramic electronic component has a ceramic element including a plurality of ceramic layers and a plurality of internal electrode layers. Each internal electrode layer is disposed between two adjacent ceramic layers. The roughness of the interface between each internal electrode layer and each ceramic layer is about 200 nm or less, and the incidence of pores in the ceramic layer is about 1% or less by area at a polished cut cross-section. The monolithic ceramic electronic component can be a monolithic ceramic capacitor, a monolithic ceramic varistor, a monolithic ceramic piezoelectric component or a monolithic substrate.

17 Claims, 1 Drawing Sheet

MONOLITHIC CERAMIC ELECTRONIC COMPONENT AND METHOD FOR MAKING THE SAME

BACKGROUND OF THE INVENTION

1. Field of the Invention

The present invention relates to electronic components and methods for making the same. In particular, the present invention relates to a monolithic ceramic electronic component having a ceramic element including ceramic layers and internal electrode layers and to a method for making the same.

2. Description of the Related Art

Dielectric ceramic materials having perovskite structures, such as barium titanate, strontium titanate and calcium titanate, have been widely used in capacitors due to the high specific dielectric constants thereof. Trends towards miniaturization of electronic components require more compact capacitors having large electrostatic capacitance.

Since conventional monolithic ceramic capacitors using dielectric ceramic materials as dielectric layers are sintered at temperatures as high as approximately 1,300° C., noble metals such as palladium must be used as internal electrode materials. The use of such expensive noble metals inevitably increases the material cost of the capacitors.

The use of base metals in internal electrodes of monolithic ceramic capacitors is progressing for solving the above problem, and various dielectric materials having reduction resistance and capable of sintering in neutral and reducing atmospheres have been developed to prevent oxidation of electrodes during sintering.

A further reduction in size and a further increase in capacitance are required for monolithic ceramic capacitors, and technologies are being developed for achieving higher dielectric constants of dielectric ceramic materials, thinner dielectric ceramic layers and thinner internal electrode layers.

When the thickness of the ceramic layer disposed between the internal electrode layers is reduced to 3 μm or less, unevenness of the interface between the dielectric ceramic layer and the internal electrode layer increases or defects or pores in the dielectric ceramic increase, resulting in shorter service lives.

A reduction in particle size of the powdered ceramic material is proposed in order to improve smoothness of green ceramic sheets for forming ceramic layers and to increase the density of the green ceramic sheet (Japanese Unexamined Patent Application Publication No. 10-223469). As the particle size decreases, the powdered ceramic readily agglomerates, resulting in poor dispersibility. Thus, the improvement in the surface smoothness and the density of the green ceramic sheet is not sufficient only by the reduction in particle size. Moreover, the dielectric constant of the powdered ceramic decreases as the particle size decreases in the same composition, and the reduction in particle size is not suitable for monolithic ceramic capacitors having higher capacitance.

As the size of the metal particles used in internal electrodes decreases, the initial sintering temperature of the metal particles decreases, and delamination will readily occur. It is difficult to use such metal particles as electrode materials for monolithic capacitors.

When the content of organic binders in ceramic is increased in order to improve the surface smoothness of a green ceramic sheet, the volume fraction of the powdered ceramic in the green ceramic sheet is decreased and the volumetric shrinkage of the ceramic element (chip) increases during sintering. When the volumetric shrinkage of the ceramic element is large, the area of the electrode paste on the green ceramic sheet also decreases in response to the areal shrinkage of the green ceramic sheet. Since the volume of the electrode material, such as nickel, is constant in the internal electrode, the thickness of the internal electrode layer unintentionally increases contrary to the trends toward thinner multilayers.

In a green ceramic sheet containing a large amount of organic binder and having a large areal shrinkage, the thickness of the electrode paste applied thereon can be reduced in consideration of the areal shrinkage of the green ceramic sheet. The reduction in thickness, however, results in the formation of pinholes in the electrode paste layer and an increase in surface roughness of the electrode due to a decreased leveling of the electrode paste. These defects decrease the electrode coverage (effective electrode area) after sintering, resulting in deterioration of electrical characteristics of the product.

The above-described problems occur also in various monolithic ceramic electronic components other than the monolithic ceramic capacitors.

SUMMARY OF THE INVENTION

It is an object of the present invention to provide a monolithic ceramic electronic component and a method for making the same, which ensure a prolonged service life due to smoothness of the interface between the internal electrode and the ceramic layer and reduce the formation of structural defects, such as delamination and curvation of the electrode in the thin multilayer configuration.

According to a first aspect of the present invention, a monolithic ceramic electronic component comprises a ceramic element including a plurality of ceramic layers and a plurality of internal electrode layers, each disposed between two adjacent ceramic layers. In the monolithic ceramic electronic component, the roughness of the interface between each internal electrode layer and each ceramic layer is 200 about nm or less, and the incidence of pores in the ceramic layer is about 1% or less by area at a polished cut cross-section.

Such roughness and incidence contribute to a prolonged service life due to improved smoothness of the interface between the internal electrode and the ceramic layer and reduced structural defects, such as delamination and curvation in the thin multilayer configuration. As a result, the monolithic ceramic electronic component can be miniaturized and exhibits superior durability.

When the roughness Ra exceeds about 200 nm, the service life of the monolithic ceramic electronic component is significantly short. When the incidence of pores exceeds about 1%, the service life of the monolithic ceramic electronic component is also significantly short.

In the present invention, the roughness of the interface represents the center-line-average roughness Ra defined by Japanese Industrial Standard (JIS) B-0601.

Examples of the monolithic ceramic electronic components of the present invention include monolithic ceramic capacitors, monolithic ceramic varistors, monolithic ceramic piezoelectric components and monolithic substrates.

In the monolithic ceramic electronic component of the present invention, the thickness of each ceramic layer disposed between the internal electrode layers is preferably about 3 μm or less.

Since the roughness of the interface is about 200 nm or less in the present invention, the thickness of the ceramic layer can be reduced to about 3 μm or less, and the monolithic ceramic electronic component can be miniaturized and exhibit superior durability. In conventional monolithic ceramic electronic components, such thin ceramic layers cause significantly short service lives.

Preferably, the thickness of each internal electrode layer is in a range of about 0.2 to 0.7 μm.

With respect to the internal electrode layer, a thickness of less than about 0.2μ is insufficient to maintain the function as the internal electrode, since this layer partially reacts with the ceramic layer during sintering and the coverage (effective electrode layer) is decreased. A thickness exceeding about 0.7 μm causes delamination which precludes the functions of the monolithic ceramic electronic component.

When the thickness of the internal electrode layer is in a range of about 0.2 to 0.7 μm, the electrode paste layer applied in the production process does not have pinholes and has a smooth surface. Moreover, the total thickness of the monolithic ceramic electronic component can be reduced. As a result, the monolithic ceramic electronic component can be miniaturized and exhibit high performance, high reliability and superior durability.

In the monolithic ceramic electronic component of the present invention, the internal electrode layers may comprise a base metal.

Regardless of the use of the base metal in the present invention, the monolithic ceramic electronic component does not cause deterioration of the service life due to unevenness of the interface and structural defects, such as delamination and curvation of the electrode in the thin multilayer configuration. Accordingly, the use of the base metal in the present invention allows reduced material cost without deterioration of reliability.

In the present invention, however, noble metals are also usable as internal electrode materials.

According to a second aspect of the present invention, a method for making the above-described monolithic ceramic electronic component comprising the steps of: laminating green ceramic sheets, each having a surface roughness of about 100 nm or less and provided with an electrode paste layer thereon, to form a green composite; compacting the green composite; and sintering the green composite to form the ceramic element.

Herein, the surface roughness of the green sheet represents the center-line-average roughness Ra defined by Japanese Industrial Standard (JIS) B-0601, as in the roughness of the interface. By using the green ceramic sheet having a surface roughness of about 100 nm or less, the roughness of the interface can be maintained at about 200 nm or less and the incidence of the pores can be reduced to about 1% or less.

In the method, green ceramic sheets not provided with electrode paste layers may be also laminated together with the green ceramic sheets provided with electrode paste layers.

According to a third aspect of the present invention, a method for making the above-described monolithic ceramic electronic component comprises the steps of: laminating green ceramic sheets, each provided with an electrode paste layer having a surface roughness of about 100 nm or less thereon, to form a green composite; compacting the green composite; and sintering the green composite to form the ceramic element.

Herein, the surface roughness of the electrode paste layer represents the center-line-average roughness Ra defined by Japanese Industrial Standard (JIS) B-0601, as in the roughness of the interface. By using the electrode paste layer having a surface roughness of about 100 nm or less, the roughness of the interface can be maintained at about 200 nm or less and the incidence of the pores can be reduced to about 1% or less.

In the method of the present invention, a surface of at least one of each ceramic green sheet and each electrode paste layer is preferably subjected to a compaction smoothing treatment.

By the compaction smoothing treatment of the surface of at least one of the ceramic green sheet and the electrode paste layer, the roughness Ra of the interface between the internal electrode layer and the ceramic layer can be reduced to be about 200 nm or less, and the incidence of the defects (pores) can be reduced to be about 1% or less.

In the present invention, the compaction smoothing treatment may be performed as follows. A green ceramic sheet is subjected to the compaction smoothing treatment and then an electrode paste layer is provided thereon. Alternatively, an electrode paste layer is provided on a green ceramic sheet subjected to the compaction smoothing treatment, and then the laminate is also subjected to the compaction smoothing treatment. Alternatively, an electrode paste layer is provided on a green ceramic sheet not subjected to the compaction smoothing treatment, and then the laminate is subjected to the compaction smoothing treatment. The compaction smoothing treatment may be performed by a hydraulic compaction method, a flat compaction method or a calender rolling method. The compaction smoothing treatment facilitates a uniform distribution of ceramic particles in the green ceramic sheet and reduces the incidence of pores in the ceramic during sintering.

In the method of the present invention, the areal shrinkage represented by the following equation is preferably about 25 to 35%:

$$(A_0 - A_1)/A_0 \times 100 (\%)$$

wherein $A_0$ represents the area viewed from the longitudinal direction (the top) of the green composite, and $A_1$ represents the area of the sintered composite.

That is, the areal shrinkage is limited to a range of 25 to 35% in this method for the following reasons.

(1) When the areal shrinkage exceeds about 35%, the thicknesses of the ceramic layer and the internal electrode layer increased due to the areal shrinkage. When the thickness of the applied internal electrode layer is reduced in consideration of the increase in the thickness due to the areal shrinkage, pinholes are formed in the internal electrode layer, resulting in decreased electrostatic capacitance after sintering.

(2) In a slurry containing ceramic particles having the same diameter, the areal shrinkage of the ceramic calculated from the volumetric ratio (72%) of the particles in hexagonal closest packing is 18%, and the areal shrinkage calculated from the volumetric ration (52%) in cubic closest packing is 30%. If metal oxide particles having significantly small diameters can be sufficiently dispersed, the areal shrinkage of the ceramic can be reduced to about 25% or less due to an improved volumetric ratio of the particles. In such a case, however, the amount of an organic binder must be reduced in the slurry. As a result, the surface roughness Ra of the ceramic green sheet is undesirably increased. Accordingly, the areal shrinkage in the present invention is preferably about 25% to 35%.

DESCRIPTION OF THE PREFERRED EMBODIMENTS

Figure 1:
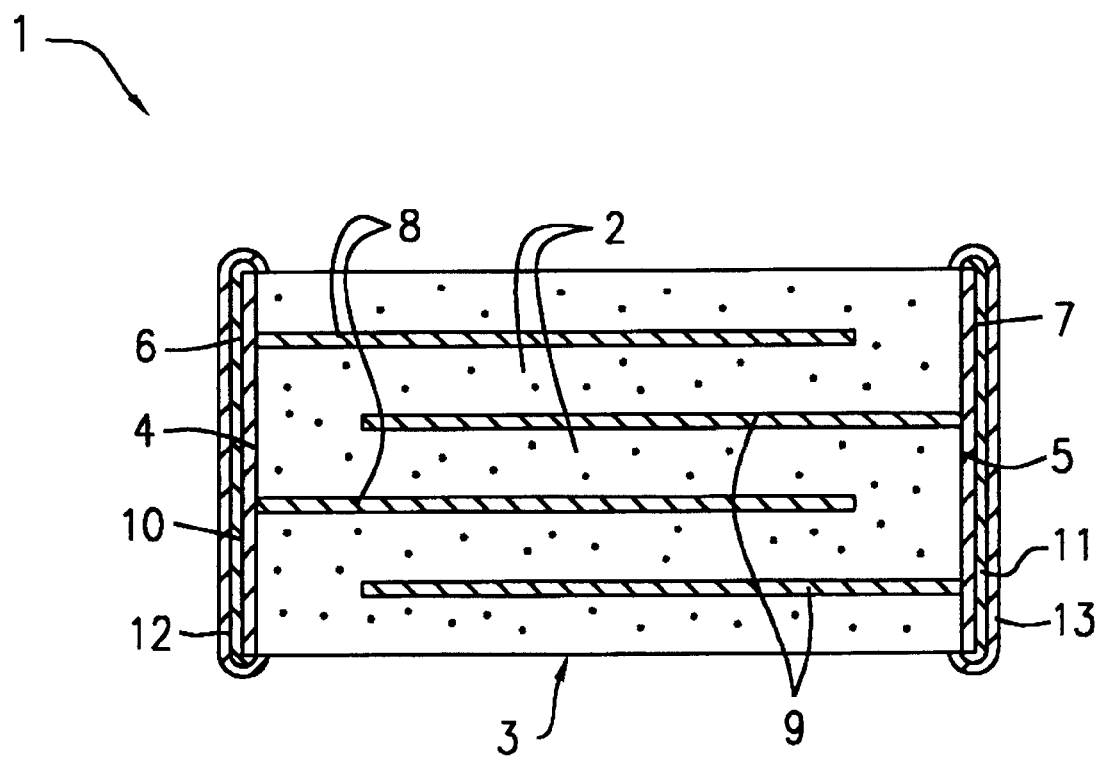
FIG. 1 is a cross-sectional view of a monolithic ceramic capacitor in accordance with an embodiment of the present invention.

The preferred embodiments of the present invention will now be described in detail with reference to a monolithic ceramic capacitor 1 having a configuration shown in FIG. 1. The monolithic ceramic capacitor 1 is of a chip type and includes a rectangular parallelepiped composite (ceramic element) 3, a first external electrode 6 provided on a first end 4 of the rectangular parallelepiped composite 3, and a second external electrode 7 provided on a second end 5 of the rectangular parallelepiped composite 3. The rectangular parallelepiped composite 3 includes dielectric ceramic layers 2, first internal electrodes 8, and second electrodes 9. The first internal electrodes 8 and the second electrodes 9 are alternately disposed among the dielectric ceramic layers 2. The first external electrode 6 is connected to the first internal electrodes 8, whereas the second external electrode 7 is connected to the second internal electrodes 9. First plating layers 10 and 11 and second plating layers 12 and 13 are formed on the external electrodes 6 and 7, respectively.

A method for making the monolithic ceramic capacitor is described.

(1) Predetermined amounts of a powdered ceramic material, such as barium titanate, and modifiers are wet-mixed and are dried to prepare a powder mixture. As modifiers, powdered oxides or carbides are generally used.

(2) An organic binder and a solvent are added to the powder mixture to prepare ceramic slurry. The ceramic slurry is extended to form a green ceramic sheet for the ceramic layer 2. The thickness of the green ceramic sheet is set to be about 3 μm or less after sintering.

The green ceramic sheet is compacted to reduce the surface roughness thereof by a hydraulic compaction method, a flat compaction method or a calender rolling method. This compaction smoothing treatment smoothes the surface of the green ceramic sheet and makes the density of the sheet uniform, reducing the formation of pores during sintering.

(3) Next, an electrode paste film (conductive paste film) for the internal electrode 8 or 9 is formed on a green ceramic sheet by a screen printing process or the like. The thickness of the electrode paste film is set so that the thickness of the sintered internal electrode is about 0.2 to 0.7 μm.

The electrode paste is composed of a mixture of a powdered metal, a binder, and a solvent. The powdered metal preferably has an average diameter of about 10 to 200 nm. Such a finely powdered metal can be uniformly dispersed by, for example, a high-pressure homogenizer.

An example electrode paste contains powdered nickel, an ethyl cellulose binder and a solvent such as terpineol.

The electrode paste is formed on the green ceramic sheet by a screen-printing process to form an electrode paste layer. As in the green ceramic sheet, a compaction smoothing treatment may be employed to reduce the surface roughness Ra of the electrode paste layer and to make the density uniform.

(4) A plurality of green ceramic sheets provided with the electrode paste layers and other green ceramic sheets are laminated and compacted and the laminate is cut into a predetermined size, if necessary. A green composite 3 in which internal electrodes 8 and 5 are exposed at ends 4 and 5, respectively, is thereby prepared.

(5) The green composite 3 is sintered in a reducing atmosphere.

(6) A conductive paste is applied onto the first and second ends 4 and 5, respectively, of the sintered composite (ceramic element) 3 and is fired to form the first and second external electrodes 6 and 7, respectively, which are electrically connected to exposed ends of the first and second internal electrodes 8 and 9, respectively.

Materials for the external electrodes 6 and 7 are not limited, and may be the same as or may be different from those for the internal electrodes 8 and 9.

(7) The external electrodes 6 and 7 may be covered with plating layers 10 and 11, respectively, composed of Ni, Cu or a Ni—Cu alloy, if necessary. Moreover, the plating layers 10 and 11 may be covered with second plating layers 12 and 13 composed of solder or tin, respectively, in order to improve solderability thereof.

EXAMPLES

The present invention is described with reference to the following EXAMPLES.

Sample Preparation (1) Powdered barium titanate (BaTiO$_3$) as a powdered ceramic raw material was prepared by a hydrolytic process, and was calcined at 800° C., 875° C. or 950° C. to form barium titanate particles having an average diameter of 98 nm, 153 nm or 210 nm, respectively.

(2) Particulate oxides of dysprosium (Dy), magnesium (Mg), manganese (Mn) and silicon (Si) were added to the barium titanate particles to prepare ceramic compositions.

(3) Polyvinyl butyral (PVB) as a binder, dioctyl phthalate (DOP) as a plasticizer, and a mixture of ethanol and toluene as a solvent were added to each ceramic composition according to the formulation shown in Table 1. The mixture was wet-dispersed and then the slurry was thoroughly dispersed by a sand mill process.

TABLE 1

| Areal Shrinkage of Ceramic | Ceramic Particles (weight percent) | PVB + DOP Total Content (weight percent) | Solvent (Ethanol + Toluene) (weight percent) |
| --- | --- | --- | --- |
| 20 | 100 | 6.9 (= 4.9 + 2.0) | 200 |
| 25 | 100 | 9.1 (= 7.1 + 2.0) | 200 |
| 30 | 100 | 11.5 (= 9.5 + 2.0) | 200 |
| 35 | 100 | 14.5 (= 12.0 + 2.5) | 200 |
| 40 | 100 | 17.7 (= 12.2 + 2.5) | 200 |

The ceramic slurry may be dispersed by a visco-mill process or a high-pressure homogenizer dispersion process, instead of the ball mill process.

(4) The ceramic slurry was spread by a doctor blade process to form a green ceramic sheet.

The total content of the PVB and DOP was varied to change the areal shrinkage of the ceramic element 3, as shown in Table 1.

The surface roughnesses Ra of the green ceramic sheets were 228 nm, 162 nm and 120 nm when the particle diameters of barium titanate were 210 nm, 153 nm or 98 nm, respectively.

(5) The green ceramic sheets were compacted using a flat pressing machine under a pressure of 500 kg/cm$^2$. The surface roughnesses Ra of the green ceramic sheets after the compaction smoothing treatment were reduced from 228 nm to 143 nm, from 162 nm to 97 nm, and from 120 nm to 48 nm.

(6) Next, spherical nickel particles having an average diameter of 200 nm, 85 nm and 45 nm were prepared by a vapor-phase reduction process (for 200 nm), a hydrogen arc process (for 85 nm) and a liquid-phase reduction process (for 45 nm).

Next, 42 percent by weight of the nickel particles, 44 percent by weight of organic vehicle prepared by dissolving 6 percent by weight of an ethyl cellulose binder into 94 percent by weight of terpineol, and 14 percent by weight of terpineol were thoroughly mixed in a ball mill or sand mill to form a nickel electrode paste. The paste may be dispersed in a visco-mill or a high-pressure homogenizer, as in the ceramic slurry.

The nickel electrode paste was applied onto the green ceramic sheets by a screen-printing process using screen patterns having different thicknesses to form electrode paste layers on the green ceramic sheets having thicknesses of 0.15 to 0.50 $\mu$m. The thickness of each green ceramic sheet was determined by an x-ray thickness gauge.

The surface roughnesses Ra of the electrode paste layers were 187 nm, 132 nm and 112 nm when the average diameter of the nickel particles were 200 nm, 85 nm and 45 nm, respectively.

(8) Each green ceramic sheet provided with the electrode paste layer was compacted using a flat pressing machine under a pressure of 500 kgf/cm$^2$. The surface roughnesses Ra of the green ceramic sheets after the compaction smoothing treatment were reduced from 187 nm to 110 nm, from 132 nm to 76 nm, and from 112 nm to 50 nm, respectively.

(9) A plurality of the green ceramic sheets were stacked and were compacted so that the electrode paste films were alternately exposed to two ends, and the laminate was cut to form a green composite (green chip) having a predetermined size.

(10) The green composite was heated to 300° C. in a nitrogen atmosphere to remove the binder, and was sintered at a maximum temperature of 1,200° C. for 2 hours in a hydrogen-nitrogen-water reducing atmosphere of an oxygen partial pressure of $10^{-9}$ to $10^{-12}$ MPa.

(11) A silver paste containing a $B_2O_3$—$Li_2O$—$SiO_2$—BaO-based frit glass was applied to the two ends of the sintered composite and was fired at 600° C. in a nitrogen atmosphere to form external electrodes which were electrically connected to the internal electrodes.

The resulting monolithic ceramic capacitor had a width of 5.0 mm, a length of 5.7 mm and a thickness of 2.4 mm, and each ceramic layer interposed among the internal electrodes had a thickness of 5 $\mu$m, 3 $\mu$m or 1 $\mu$m. The monolithic ceramic capacitor included five effective dielectric ceramic layers and the effective area (opposing area) of each internal electrode layer was $16.3 \times 10^{-6}$ m$^2$.

Evaluation of Samples

The composite structure, electrical characteristics and reliability of each monolithic ceramic capacitor were evaluated as follows.

The roughness Ra of the interface of the internal electrode and the ceramic layer was determined by an image analysis of a scanning electron micrograph of a cross-section of a cut sample of the monolithic ceramic capacitor.

The incidence of the defects (pores) in the ceramic layer was also determined by the image analysis of the micrograph.

The surface roughnesses Ra of the green ceramic sheet and the electrode paste layer were determined by measuring an area of 20 $\mu$m square using an atomic force microscope.

The thicknesses of the internal electrode and the ceramic layer were determined by an image analysis of a polished cross-section of a cut sample of the monolithic ceramic capacitor using a scanning electron microscope.

The delamination (interlayer cleavage) in the polished cross-section was also observed using the scanning electron microscope.

The electrostatic capacitance and the dielectric loss (tan $\delta$) were measured using an automatic bridge meter according to Japanese Industrial Standard (JIS) 5102 and the specific dielectric constant ($\in$r) was calculated from the observed electrostatic capacitance.

As a high-temperature loading test, the change in insulation resistance over time was measured at 150° C. while a DC voltage of 10 V was applied. In the high-temperature loading test, each sample was regarded as failure when the insulation resistance become $10^5 \Omega$ or less, and an average service life of 50 samples was determined from this time.

The results are shown in Tables 2 and 3, wherein asterisks (*) indicate that the samples are outside the present invention.

TABLE 2

| Sample | Roughness of Interface Ra (nm) | Incidence of Pores (%) | Green Ceramic Sheet Ra (nm) | Smoothing Performed | Smoothing Not Performed | Electrode Paste Layer Ra (nm) | Smoothing Performed | Smoothing Not Performed | Applied Thickness ($\mu$m) | Thickness of Ceramic Layer ($\mu$m) |
|---|---|---|---|---|---|---|---|---|---|---|
| 1* | 382 | 3.0 | 228 |   | ○ | 187 |   | ○ | 0.30 | 3 |
| 2* | 350 | 2.1 | 143 | ○ |   | 187 |   | ○ | 0.30 | 3 |
| 3* | 288 | 2.5 | 228 |   | ○ | 110 | ○ |   | 0.30 | 3 |
| 4* | 280 | 1.8 | 143 | ○ |   | 110 | ○ |   | 0.30 | 3 |
| 5* | 289 | 1.6 | 162 |   | ○ | 132 |   | ○ | 0.30 | 3 |
| 6* | 255 | 0.8 | 97 | ○ |   | 132 |   | ○ | 0.30 | 3 |
| 7* | 231 | 1.2 | 162 |   | ○ | 76 | ○ |   | 0.30 | 3 |
| 8 | 125 | 0.8 | 97 | ○ |   | 76 | ○ |   | 0.30 | 3 |
| 9 | 176 | 0.7 | 120 |   | ○ | 112 |   | ○ | 0.30 | 3 |
| 10 | 114 | 0.3 | 48 | ○ |   | 112 |   | ○ | 0.30 | 3 |
| 11 | 110 | 0.2 | 120 |   | ○ | 50 | ○ |   | 0.30 | 3 |
| 12 | 79 | 0.2 | 48 | ○ |   | 50 | ○ |   | 0.30 | 3 |
| 13 | 130 | 0.6 | 112 | ○ |   | 50 | ○ |   | 0.15 | 3 |
| 14 | 130 | 0.6 | 112 | ○ |   | 50 | ○ |   | 0.50 | 3 |
| 15 | 92 | 0.5 | 76 | ○ |   | 50 | ○ |   | 0.15 | 3 |

TABLE 2-continued

| Sample | Roughness of Interface Ra (nm) | Incidence of Pores (%) | Green Ceramic Sheet Ra (nm) | Smoothing Performed | Smoothing Not Performed | Electrode Paste Layer Ra (nm) | Smoothing Performed | Smoothing Not Performed | Applied Thickness (μm) | Thickness of Ceramic Layer (μm) |
|---|---|---|---|---|---|---|---|---|---|---|
| 16 | 92 | 0.5 | 76 | ○ | | 50 | ○ | | 0.50 | 3 |

| Sample | Thickness of Internal Electrode Layer (μm) | Areal Shrinkage of Ceramic (%) | Incidence of Delamination (%) | εr (--) | tanδ (%) | Average Service Life (hr) |
|---|---|---|---|---|---|---|
| 1* | 0.45 | 30 | 0 | 1650 | 2.4 | 1 |
| 2* | 0.45 | 30 | 0 | 1600 | 2.4 | 1 |
| 3* | 0.45 | 30 | 0 | 1640 | 2.4 | 2 |
| 4* | 0.45 | 30 | 0 | 1660 | 2.4 | 4 |
| 5* | 0.45 | 30 | 0 | 1580 | 2.3 | 4 |
| 6* | 0.45 | 30 | 0 | 1560 | 2.4 | 11 |
| 7* | 0.45 | 30 | 0 | 1570 | 2.4 | 16 |
| 8 | 0.45 | 30 | 0 | 1590 | 2.4 | 67 |
| 9 | 0.45 | 30 | 0 | 1440 | 2.2 | 52 |
| 10 | 0.45 | 30 | 0 | 1480 | 2.3 | 73 |
| 11 | 0.45 | 30 | 0 | 1490 | 2.3 | 81 |
| 12 | 0.45 | 30 | 0 | 1480 | 2.3 | 90 |
| 13 | 0.20 | 20 | 55 | 1420 | 2.3 | 40 |
| 14 | 0.60 | 20 | 60 | 1480 | 2.4 | 43 |
| 15 | 0.20 | 25 | 0 | 1520 | 2.3 | 85 |
| 16 | 0.70 | 25 | 0 | 1480 | 2.3 | 82 |

TABLE 3

| Sample | Roughness of Interface Ra (nm) | Incidence of Pores (%) | Green Ceramic Sheet Ra (nm) | Smoothing Performed | Smoothing Not Performed | Electrode Paste Layer Ra (nm) | Smoothing Performed | Smoothing Not Performed | Applied Thickness (μm) | Thickness of Ceramic Layer (μm) |
|---|---|---|---|---|---|---|---|---|---|---|
| 17(12) | 79 | 0.2 | 48 | ○ | | 50 | ○ | | 0.30 | 3 |
| 18 | 79 | 0.2 | 48 | ○ | | 50 | ○ | | 0.50 | 3 |
| 19 | 70 | 0.0 | 45 | ○ | | 50 | ○ | | 0.30 | 3 |
| 20 | 70 | 0.0 | 45 | ○ | | 50 | ○ | | 0.50 | 3 |
| 21 | 65 | 0.2 | 40 | ○ | | 50 | ○ | | 0.50 | 3 |
| 22 | 65 | 0.2 | 40 | ○ | | 50 | ○ | | 0.30 | 3 |
| 23* | 282 | 0.0 | 155 | ○ | | 144 | ○ | | 0.50 | 3 |
| 24 | 124 | 1.8 | 108 | ○ | | 87 | ○ | | 0.30 | 5 |
| 25 | 76 | 0.2 | 50 | ○ | | 51 | ○ | | 0.30 | 5 |
| 26(4)* | 280 | 0.2 | 143 | ○ | | 110 | ○ | | 0.30 | 3 |
| 27(8) | 125 | 1.8 | 97 | ○ | | 132 | ○ | | 0.30 | 3 |
| 28(12) | 79 | 0.2 | 48 | ○ | | 50 | ○ | | 3 | |
| 29* | 264 | 1.8 | 150 | ○ | | 132 | ○ | | 0.30 | 1 |
| 30 | 102 | 0.0 | 98 | ○ | | 80 | ○ | | 0.30 | 1 |
| 31 | 76 | 0.0 | 42 | ○ | | 46 | ○ | | 0.30 | 1 |

| Sample | Thickness of Internal Electrode Layer (μm) | Areal Shrinkage of Ceramic (%) | Incidence of Delamination (%) | εr (--) | tanδ (%) | Average Service Life (hr) |
|---|---|---|---|---|---|---|
| 17(12) | 0.45 | 30 | 0 | 1480 | 2.3 | 90 |
| 18 | 0.70 | 30 | 0 | 1470 | 2.4 | 87 |
| 19 | 0.50 | 35 | 0 | 1510 | 2.3 | 80 |
| 20 | 0.70 | 35 | 0 | 1460 | 2.4 | 82 |
| 21 | 0.70 | 40 | 25 | 1420 | 2.1 | 50 |
| 22 | 0.50 | 40 | 25 | 1410 | 2.2 | 52 |
| 23* | 0.85 | 30 | 0 | 1620 | 2.4 | 30 |
| 24 | 0.45 | 30 | 0 | 1520 | 2.3 | 280 |
| 25 | 0.45 | 30 | 0 | 1520 | 2.3 | 300 |
| 26(4)* | 0.45 | 30 | 0 | 1660 | 2.4 | 4 |
| 27(8) | 0.45 | 30 | 0 | 1590 | 2.4 | 67 |
| 28(12) | 0.45 | 30 | 0 | 1480 | 2.3 | 90 |

TABLE 3-continued

| | | | | | | |
|---|---|---|---|---|---|---|
| 29* | 0.45 | 30 | 0 | 1610 | 2.4 | 0.1 |
| 30 | 0.45 | 30 | 0 | 1530 | 2.3 | 42 |
| 31 | 0.45 | 30 | 0 | 1420 | 2.5 | 55 |

In Sample 1, which is outside the present invention, the roughness Ra of the interface between the internal electrode layer and the ceramic layer exceeds 200 mm, and the incidence of pores (percent by area) exceeds 1%, and the average service life (reliability) is significantly short. The surface roughnesses Ra of the ceramic green sheets and the electrode paste layer are 228 nm and 187 nm, respectively.

In Samples 2 to 4 (outside of the present invention), each green ceramic sheet and each electrode paste layer are subjected to smoothing. Thus, the surface roughnesses Ra thereof are decreased and the incidence of the pores is also decreased. The average service life, however, is short.

In Sample 5 (outside of the present invention), the surface roughnesses Ra of the green ceramic sheet and the electrode paste layer are 162 nm and 132 nm, respectively, the roughness Ra of the interface exceeds 200 nm, the incidence of pores exceeds 1%, and the average service life is short.

In Samples 6 and 7 (outside the present invention), either the green ceramic sheet or the electrode paste layer is subjected to smoothing. In sample 6 in which only the green ceramic sheet is smoothed, the average service life is short due to the roughness Ra of the interface between the internal electrode layer and the ceramic layer, although the incidence of pores is less than 1%. In Sample 7 in which only the electrode paste layer is smoothed, both the incidence of pores and the roughness of the interface are outside the present invention, and the average service life is short.

In Sample 8, in accordance with the present invention, both the green ceramic sheet and the electrode paste layer are smoothed, and the surface roughnesses Ra thereof are less than 100 nm. The roughness Ra of the interface between the internal electrode layer and the ceramic layer is less than 200 nm, and the incidence of the pore is less than 1%. Thus, the average service life of the capacitor is prolonged.

In Sample 9, the green ceramic sheet and the electrode paste layer are not smoothed; however, the roughness Ra of the interface is less than 200 nm, and the incidence of the pores is less than 1%. Thus, the average service life is prolonged.

In Sample 10 in which only the green ceramic sheet is smoothed, the roughness Ra of the interface is less than 200 nm, and the incidence of the pores is less than 1%. Thus, the average service life is prolonged.

In Sample 11 in which only the electrode paste layer is smoothed, the roughness Ra of the interface is less than 200 nm, and the incidence of the pores is less than 1%. Thus, the average service life is prolonged.

In Sample 12 in which both the green ceramic sheet and the electrode paste layer are smoothed, the surface roughnesses Ra thereof are less than 100 nm. Moreover, the roughness Ra of the interface between the internal electrode layer and the ceramic layer is less than 100 nm, and the incidence of the pore is less than 0.5%. Thus, the average service life of the capacitor is further prolonged.

Accordingly, highly reliable monolithic ceramic capacitors are obtainable when the roughness Ra of the interface between the internal electrode layer and the ceramic layer is 200 nm or less and when the incidence of the pores are 1% or less.

The roughness Ra of the interface between the internal electrode layer and the ceramic layer of 200 nm or less is achieved when the surface roughness Ra of the green ceramic sheet is 100 nm or less and when the surface roughness Ra of the electrode paste layer formed on the green ceramic sheet by printing is 100 nm or less.

The compaction smoothing treatment of the green ceramic sheet and the electrode paste layer is effective for smoothing the interface, the surface of the green ceramic sheet, and the surface of the electrode paste layer, and for reducing the incidence of pores in the ceramic layer.

Cases when the ceramic areal shrinkage is varied on the basis of Sample 12, in addition to the roughnesses Ra of the interface and the surfaces, will now be described. In each of Samples 13 to 22, the areal shrinkage of the ceramic is 20%, 25%, 30% or 40%. In all samples, the roughness Ra of the interface between the internal electrode layer and the ceramic layer is less than 200 mn and the average service life is prolonged. When the areal shrinkage is 40% as in Samples 21 and 22, the thickness of the internal electrode layer and the thickness of the ceramic layer tend to increase. Moreover, delamination readily occurs due to large volumetric shrinkage. Since the binder content in the sheet is low at the areal shrinkage of 20%, the surface roughness Ra of the green ceramic sheet is increased and the roughness Ra of the interface between the internal electrode layer and the ceramic layer is increased, although the thickness of the internal electrode and the thickness of the ceramic layer are maintained at low levels. As a result, reliability of the monolithic ceramic capacitor tends to decrease. Moreover, the low binder content facilitates delamination due to poor adhesion of the sheets. These results suggest that the areal shrinkage of the ceramic is more preferably in a range of about 25 to 35%.

In Samples 23 to 31, the thickness of the ceramic layer is varied to 5 $\mu$m, 3 $\mu$m or 1$\mu$. The reliability of the monolithic ceramic capacitor highly depends on the thickness of the ceramic layer (dielectric ceramic layer), and the number of grains per unit thickness. In general, reliability increases as the thickness of the dielectric ceramic layer increases and as the number of the grains increases. However, a larger thickness of the dielectric ceramic layer is disadvantageous to higher lamination (higher capacitance) in view of the chip size of the monolithic ceramic capacitor.

The thickness of the ceramic layer is 5 $\mu$m in Samples 23 to 25, 3 $\mu$m in Samples 26 to 28, or 1 $\mu$m in Samples 29 to 31. In the case of the thickness of the ceramic layer of 5 $\mu$m or 3 $\mu$m, when the roughness Ra of the interface between the internal electrode and the ceramic layer is less than 200 nm and when the incidence of the pores is less than 1%, the average service life is prolonged. In the case of the thickness of the ceramic layer of 1 $\mu$m, when the roughness Ra of the interface is less than 100 nm and particularly 100 nm, the average service life is prolonged and the reliability is high.

Among Samples 23 to 31, the average service life is short in Samples 23, 26 and 29 (outside the present invention), in which the roughness Ra of the interface exceeds 200 nm.

Accordingly, the roughness Ra of the interface between the internal electrode layer and the ceramic layer functions as a particularly effective parameter when the thickness of the ceramic layer is about 3 $\mu$m or less.

In the EXAMPLES, the monolithic ceramic capacitors include dielectric ceramic layers composed of barium titanate and internal electrode layers composed of nickel. The dielectric ceramic layers may be composed of other perovskite materials, such as strontium titanium and calcium titanium. The internal electrode layers may be composed of other materials, such as Pd, Ag, Ag—Pd and Cu.

The present invention is also applicable to various monolithic ceramic electronic components, such as monolithic ceramic varistors, monolithic ceramic piezoelectric components, and monolithic substrates, as well as the above-described monolithic ceramic capacitors.

What is claimed is:

1. A monolithic ceramic electronic component comprising a ceramic element comprising a plurality of ceramic layers and a plurality of internal electrode layers, each of the internal electrodes disposed between two adjacent ceramic layers,
    wherein the roughness of the interface between each internal electrode layer and each ceramic layer is about 200 nm or less, and the incidence of pores in the ceramic layer is about 1% or less by area at a polished cut cross-section.

2. A monolithic ceramic electronic component according to claim 1, wherein the thickness of each ceramic layer which is disposed between the internal electrode layers is about 3 $\mu$m or less.

3. A monolithic ceramic electronic component according to claim 2, wherein the thickness of each internal electrode layer is in a range of about 0.2 to 0.7 $\mu$m.

4. A monolithic ceramic electronic component according to claim 3, wherein the internal electrode layers comprise a base metal.

5. A monolithic ceramic electronic component according to claim 4, wherein the roughness of the interface between each internal electrode layer and each ceramic layer is about 120 nm or less, and the incidence of pores in the ceramic layer is about 0.8% or less.

6. A monolithic ceramic electronic component according to claim 2, wherein the internal electrode layers comprise a base metal.

7. A monolithic ceramic electronic component according to claim 6, wherein the roughness of the interface between each internal electrode layer and each ceramic layer is about 120 nm or less, and the incidence of pores in the ceramic layer is about 0.8% or less.

8. A monolithic ceramic electronic component according to claim 1, wherein the internal electrode layers comprise a base metal.

9. A monolithic ceramic electronic component according to claim 8, wherein the roughness of the interface between each internal electrode layer and each ceramic layer is about 120 nm or less, and the incidence of pores in the ceramic layer is about 0.8% or less.

10. A monolithic ceramic electronic component according to claim 1, wherein the thickness of each internal electrode layer is in a range of about 0.2 to 0.7 $\mu$m.

11. A monolithic ceramic electronic component according to claim 10, wherein the internal electrode layers comprise a base metal.

12. A monolithic ceramic electronic component according to claim 1, wherein the roughness of the interface between each internal electrode layer and each ceramic layer is about 120 nm or less, and the incidence of pores in the ceramic layer is about 0.8% or less.

13. A method for making a monolithic ceramic electronic component of claim 1 comprising the steps of:
    laminating green ceramic sheets provided with an electrode paste layer thereon to form a green composite, wherein the ceramic sheets or the electrode paste or both have a surface roughness of about 100 nm or less;
    compacting the green composite; and
    sintering the green composite to form the ceramic element.

14. The method for making a monolithic ceramic electronic component of claim 13 wherein the ceramic green sheets have a surface roughness of 100 nm or less.

15. The method for making a monolithic ceramic electronic component of claim 13 wherein the electrode paste layer has a surface roughness of 100 nm or less.

16. A method for making a monolithic ceramic electronic component according to claim 13, wherein a surface of at least a ceramic green sheet or an electrode paste layer or both are subjected to a compaction smoothing treatment.

17. A method for making a monolithic ceramic electronic component according to claim 16, wherein the compaction smoothing treatment is effected such that the areal shrinkage represented by $$(A_0-A_1)/A_0 \times 100 (\%)$$

wherein $A_0$ represents the area viewed from the longitudinal direction of the green composite and $A_1$ represents the area of the sintered composite is about 25 to 35%.

* * * * *